United States Patent
Yao

(10) Patent No.: US 11,412,169 B2
(45) Date of Patent: Aug. 9, 2022

(54) PIXEL CIRCUIT OUTPUTTING OVER EXPOSURE INFORMATION AND METHOD OF CALCULATING REAL INTENSITY THEREOF, PIXEL ARRAY HAVING THE SAME

(71) Applicant: PixArt Imaging Inc., Hsin-Chu County (TW)

(72) Inventor: Wen-Han Yao, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 121 days.

(21) Appl. No.: 17/069,013

(22) Filed: Oct. 13, 2020

(65) Prior Publication Data

US 2021/0385401 A1    Dec. 9, 2021

Related U.S. Application Data

(60) Provisional application No. 63/033,877, filed on Jun. 3, 2020.

(51) Int. Cl.
| | |
|---|---|
| *H04N 5/378* | (2011.01) |
| *H04N 5/376* | (2011.01) |
| *H04N 5/235* | (2006.01) |
| *H01L 27/148* | (2006.01) |
| *H01L 27/146* | (2006.01) |

(52) U.S. Cl.
CPC ....... *H04N 5/378* (2013.01); *H01L 27/14612* (2013.01); *H01L 27/14643* (2013.01); *H01L 27/14831* (2013.01); *H04N 5/2353* (2013.01); *H04N 5/3765* (2013.01)

(58) Field of Classification Search
CPC .... H04N 5/378; H04N 5/2353; H04N 5/3765; H04N 5/359; H04N 5/37455; H01L 27/14612; H01L 27/14643; H01L 27/14831

See application file for complete search history.

(56) References Cited

U.S. PATENT DOCUMENTS

| | | | |
|---|---|---|---|
| 10,853,615 B2 * | 12/2020 | Fang | G06F 3/0416 |
| 2004/0036797 A1 * | 2/2004 | Stark | H04N 5/35509 348/229.1 |
| 2006/0049337 A1 * | 3/2006 | Waeny | H04N 5/35527 257/E27.128 |

FOREIGN PATENT DOCUMENTS

CN    109889735 A  *  6/2019  ............. H04N 5/235

* cited by examiner

*Primary Examiner* — Nhan T Tran
(74) *Attorney, Agent, or Firm* — Hauptman Ham, LLP

(57) ABSTRACT

There is provided a pixel circuit including a first circuit and a second circuit. The first circuit is used to output a first voltage associated with exposure intensity. The second circuit is used to output a second voltage associated with exposure time interval. The processor multiples the first voltage to a ratio between a reference voltage and the second voltage to obtain an actual light intensity, wherein the reference voltage is a voltage value outputted by the second circuit of a dummy pixel.

20 Claims, 6 Drawing Sheets

PIXEL CIRCUIT OUTPUTTING OVER EXPOSURE INFORMATION AND METHOD OF CALCULATING REAL INTENSITY THEREOF, PIXEL ARRAY HAVING THE SAME

RELATED APPLICATIONS

The present application claims the priority benefit of U.S. Provisional Application Ser. No. 63/033,877, filed on Jun. 3, 2020, the disclosure of which is hereby incorporated by reference herein in its entirety.

BACKGROUND

1. Field of the Disclosure

This disclosure generally relates to a pixel structure and, more particularly, to a pixel circuit capable of outputting actual exposure information even under over exposure, and a pixel array using the same and an operating method of the pixel circuit.

2. Description of the Related Art

The pixel circuit uses a photodiode to receive incident light within an exposure period to output a voltage value associated with intensity of incident light to indicate the ambient light intensity. However, when the ambient light is too strong to cause charges accumulated by the pixel circuit to reach the full well capacity (FWC) before the exposure period is over, actual incident light intensity cannot be reflected by the pixel output.

For example referring to FIG. 1, before a time point T1, the pixel circuit accumulates charges normally. When the pixel circuit reaches FWC to have saturation at the time point T1, the light energy after the time point T1 cannot be accumulated continuously by the pixel circuit. Meanwhile, the processor only receives a full-scale digital value outputted by an analog-to-digital converter such that the actual incident light intensity cannot be known.

Accordingly, the present disclosure provides a pixel circuit that outputs actual exposure information even under over exposure, and a pixel array using the same and an operating method of the pixel array.

SUMMARY

The present disclosure provides a pixel circuit that includes an exposure circuit and a timing circuit. The exposure circuit is used to output a first voltage associated with the exposure intensity, and the timing circuit is used to output a second voltage associated with the exposure time interval.

The present disclosure further provides a pixel array that includes multiple normal pixels and a dummy pixel. Each of the multiple normal pixels is used to output a first voltage associated with the exposure intensity and a second voltage associated with the exposure time interval. The dummy pixel is used to output a reference voltage. A processor calculates real light intensity using the first voltage, the second voltage and the reference voltage.

The present disclosure provides a pixel circuit including a first circuit and a second circuit. The first circuit includes a photodiode, a transfer transistor and a first capacitor. The photodiode is configured to be exposed in an exposure period. The first capacitor is configured to store charges generated by the photodiode via the transfer transistor to generate a first voltage. The second circuit includes a control circuit and a timing circuit. The control circuit is connected to the first capacitor, and configured to generate a control signal according to a voltage drop on the first capacitor before the transfer transistor is conducted to transfer the charges generated by the photodiode to the first capacitor. The timing circuit is connected to the control circuit, and configured to determine a discharging time of a second capacitor in the timing circuit according to the control signal to generate a second voltage. The first voltage is associated with light intensity, and the second voltage is associated with an overflow time.

The present disclosure further provides a pixel array including multiple normal pixels and at least one dummy pixel. Each of the multiple normal pixels includes a first circuit and a second circuit. The first circuit includes a photodiode, a transfer transistor and a first capacitor. The photodiode is configured to be exposed in an exposure period. The first capacitor is configured to store charges generated by the photodiode via the transfer transistor to generate a first voltage. The second circuit includes a control circuit and a timing circuit. The control circuit is connected to the first capacitor, and configured to generate a control signal according to a voltage drop on the first capacitor before the transfer transistor is conducted to transfer the charges generated by the photodiode to the first capacitor. The timing circuit is connected to the control circuit, and configured to determine a discharging time of a second capacitor in the timing circuit according to the control signal to generate a second voltage. The at least one dummy pixel has a same pixel structure with the normal pixel, and a second capacitor of the at least one dummy pixel is configured to generate a reference voltage. A product of the first voltage and a ratio between the reference voltage and the second voltage is configured as a real intensity.

The present disclosure further provides a method of calculating a real intensity of a pixel circuit including the steps of: resetting the pixel circuit; exposing the pixel circuit within an exposure period; reading a time point at which a first capacitor of the pixel circuit has a voltage drop before an end of the exposure period as well as a first voltage of the first capacitor after the voltage drop; and calculating the real intensity based on a ratio between the exposure period and a time interval between a start of the exposing and the time point.

In the present disclosure, the dummy pixel is also called a dark pixel that has the same structure with the normal pixel and is arranged in the same pixel array. The difference between the dummy pixel and the normal pixel is that the dummy pixel is covered by an opaque layer such that a photodiode therein is not exposed to light within the exposure period. As the photodiode of the dummy does not have an overflow, an output voltage value of a second capacitor thereof is used as a reference voltage for calculating real light intensity detected by the normal pixel.

In the present disclosure, the real light intensity is a gray value exceeding the resolution of the analog-to-digital converted and is used by the processor to perform the identification, e.g., motion detection or displacement.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
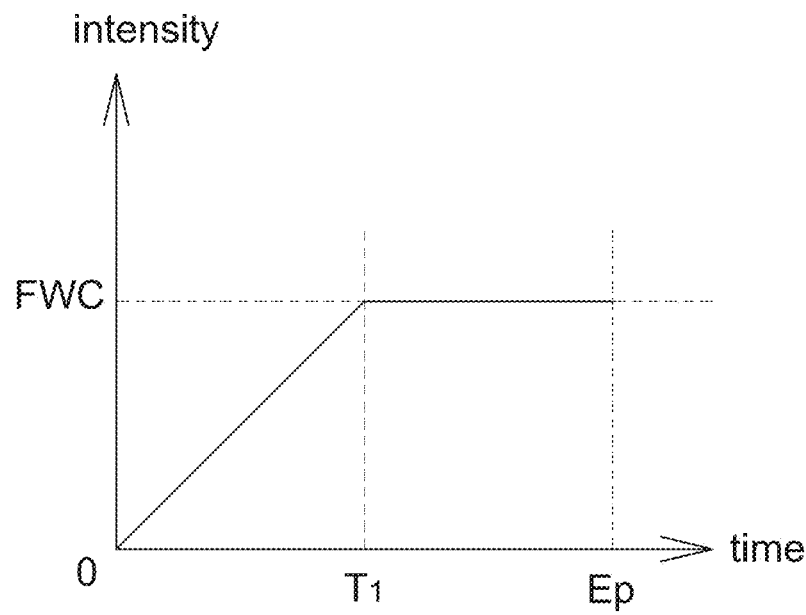
FIG. 1 is a schematic diagram of the charge accumulation while over exposure occurring.
Figure 2:
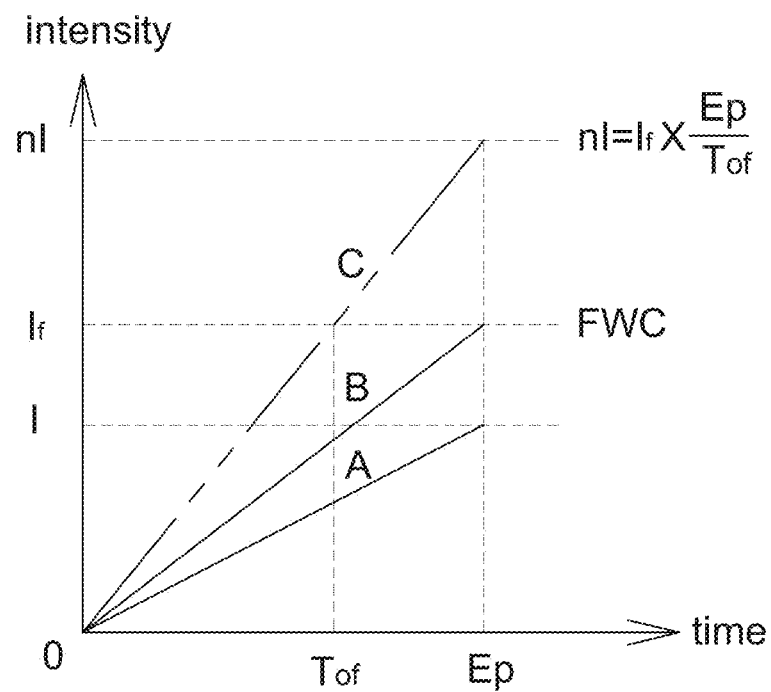
FIG. 2 is a schematic diagram of calculating real light intensity by an optical sensor according to one embodiment of the present disclosure.

The optical sensor of the present disclosure calculates real light intensity detected by a pixel circuit using post-processing even an over exposure that causes a photodiode to overflow occurs within an exposure period. As shown in FIG. 2, it is assumed that the exposure period is Ep. When the photodiode does not overflow within the exposure period Ep, the charge accumulation is shown by a line section A, and a detected voltage outputted by the pixel circuit indicates the real light intensity I (sometimes referring to real intensity herein); whereas, when the photodiode accumulates charges to the full well capacity (FWC) just at an end of the exposure period Ep, the pixel circuit outputs light intensity If shown by a line section B. However, as shown by a line section C, if the photodiode accumulates charges to reach the FWC (e.g., at time Tof) within the exposure period Ep, the photodiode has an overflow. As long as Tof<Ep, the pixel circuit outputs a voltage value corresponding to the light intensity If, and an analog-to-digital converter (ADC) connected downstream outputs a full-scale digital value, e.g., 255, but not limited to. In the present disclosure, If is equal to the FWC or a fraction (e.g., 80% to 90%, but not limited to) of the FWC.

The present disclosure detects an overflow time Tof and multiplies the light intensity If to a ratio between the exposure period Ep and the overflow time Tof to obtain light energy nI actually detected by a pixel circuit, i.e. nI=If×(Ep/Tof). In this way, the optical sensor of the present disclosure obtains a digital value higher than the full-scale digital value.

Figure 3:
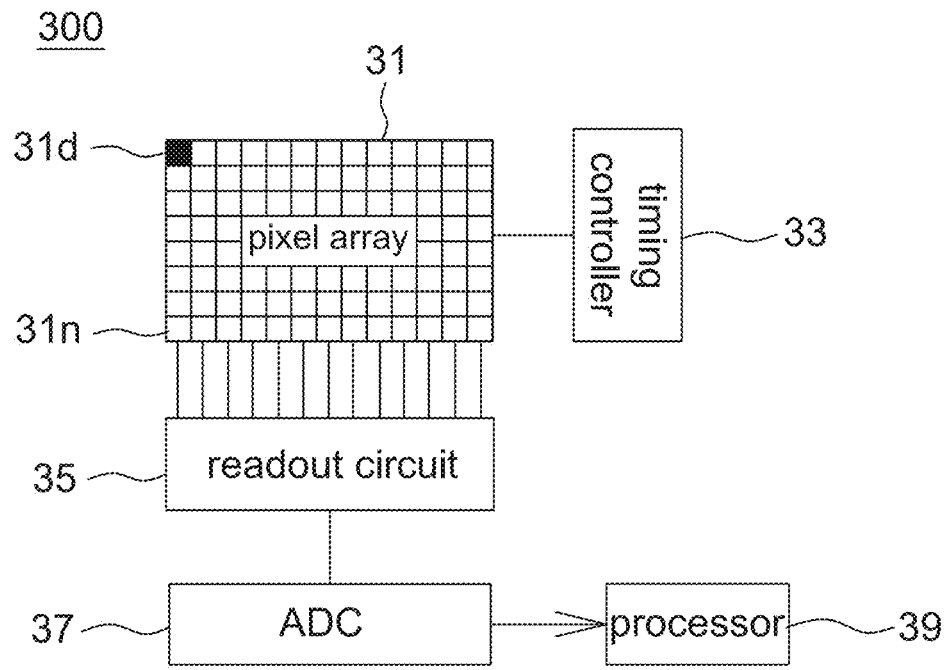
FIG. 3 is a schematic block diagram of an optical sensor according to one embodiment of the present disclosure.

Referring to FIG. 3, it is a schematic block diagram of an optical sensor 300 according to one embodiment of the present disclosure. The optical sensor 300 includes a pixel array 31, a timing controller 33, a readout circuit 35, an analog-to-digital converter (ADC) 37 and a processor 39. The timing controller 33 is used to generate control signals to control switching elements (e.g., transistors) in the pixel array 31 to perform the scanning and signal outputting. The readout circuit 35 is used to read voltage values detected by each pixel of the pixel array 31, wherein the readout circuit 35 uses correlation double sampling (CDS) to sample pixel data. The ADC 37 is used to convert analog signals read by the readout circuit 35 to digital values. The operations of the readout circuit 35 and the ADC 37 are known to the art and not main objectives of the present disclosure, and thus are not described herein.

The pixel array 31 includes multiple normal pixels 31n (e.g., shown as blank rectangles) and at least one dummy pixel 31d (e.g., shown as a black rectangle). The at least one dummy pixel 31d has the same pixel structure as the normal pixels 31n, and a difference therebetween is that the dummy pixel 31d is covered by an opaque layer to block a photodiode therein from receiving incident light, wherein the method of covering an opaque layer on a normal pixel to form a dummy pixel is known to the art, and thus not described herein. Although FIG. 3 shows a single dummy pixel 31d, the present disclosure is not limited thereto. In other aspects, the pixel array 31 includes multiple dummy pixels 31d, e.g., one dummy pixel corresponding to a column of normal pixels 31n. In the present disclosure, arrangement of the position and the number of the dummy pixel 31d is not particularly limited.

Figure 4:
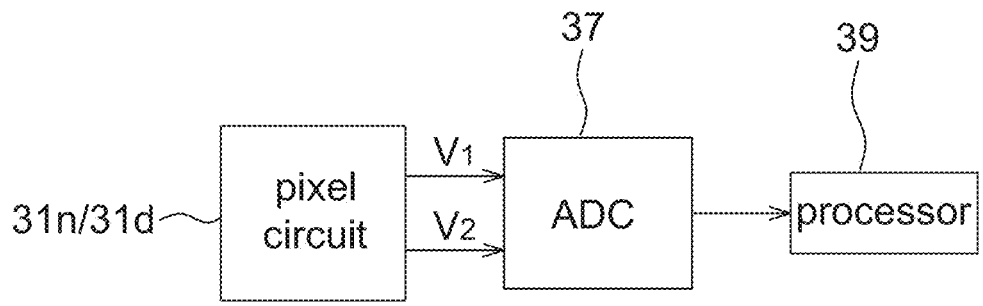
FIG. 4 is another schematic block diagram of an optical sensor according to one embodiment of the present disclosure.

Please referring to FIG. 4, it is another schematic block diagram of an optical sensor according to one embodiment of the present disclosure. FIG. 4 shows that the pixel circuit 31n/31d outputs a first voltage V1 and a second voltage V2 to the ADC 37 (for simplification purposes the readout circuit 35 therebetween being omitted), via a readout line, wherein the first voltage V1 is a voltage value associated with light intensity, and the second voltage V2 is a voltage value associated with an overflow time Tof (e.g., referring to FIG. 2). In one aspect, the dummy pixel 31d outputs the second voltage V2 to the ADC 37 without outputting the first voltage V1. In an alternative aspect, the dummy pixel 31d outputs the first voltage V1 and the second voltage V2 to the ADC 73 to be converted to digital values. The ADC 37 converts the first voltage V1 and the second voltage V2 into digital values to be sent to the processor 39, but the processor 39 does not process or use the first voltage V1 of the dummy pixel 31d.

In the present disclosure, the second voltage V2 outputted by the dummy pixel 31d is used as a reference voltage.

The processor 37 is, for example, a digital signal processor (DSP) or an application specific integrated circuit (ASIC) that calculates, for each normal pixel 31n, a product of the first voltage V1 and a ratio between the reference voltage and the second voltage V2 as a real intensity value. Accordingly, even under over exposure, the image frame generated by the processor 39 reflects actual ambient light intensity without being limited by the full-scale digital value of the ADC 37.

When the pixel array 31 includes a single dummy pixel 31d, the reference voltage generated by the single dummy pixel 31d is provided to the processor 39 for calculating the real intensity of all normal pixels 31n. When the pixel array 31 includes one row of dummy pixels 31d and each dummy pixel among the one row of dummy pixels 31d corresponds to one column of normal pixels 31n, the reference voltage generated by each dummy pixel 31d is provided to the processor 39 for calculating the real intensity of the corresponding column of normal pixels 31n. In the present disclosure, when a photodiode of the normal pixel 31n has an overflow within an exposure period, the real intensity is larger than the first voltage V1 outputted by the normal pixel 31n; whereas, if the photodiode does not overflow within the exposure period, because the reference voltage is substantially identical to the second voltage V2 outputted by the normal pixel 31n, the calculated real intensity is substantially identical to the first voltage V1 outputted by the normal pixel 31n.

Figure 5:
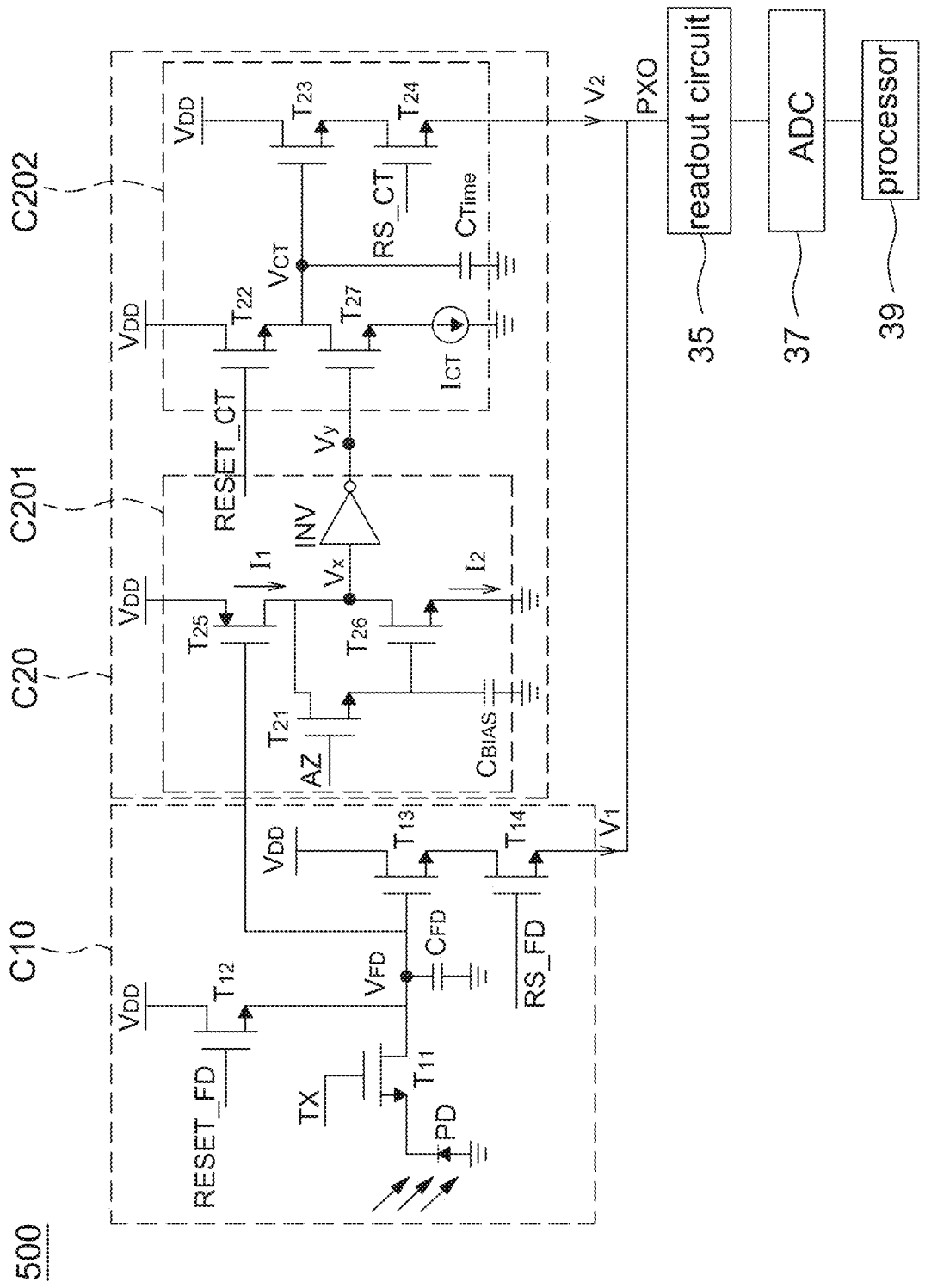
FIG. 5 is a circuit diagram of a pixel circuit according to one embodiment of the present disclosure.

Please referring to FIG. 5, it is a circuit diagram of a pixel circuit 500 according to one embodiment of the present disclosure. The pixel circuit 500 shows the pixel structure of the normal pixel 31n and the dummy pixel 31d in FIG. 3. The pixel circuit 500 includes a first circuit C10 and a second circuit C20, wherein the first circuit C10 is used to generate a first voltage V1 and the second circuit C20 is used to generate a second voltage V2.

In the normal pixel 31n, the first voltage V1 and the second voltage V2 are sequentially read by the same readout line PXO (e.g., a first readout line), i.e. the first readout line being connected to the first capacitor $C_{FD}$ and the second capacitor $C_{Time}$ of the normal pixel 31n. In the present disclosure, as the first voltage V1 of the dummy pixel 31d is not used by the processor 29, the readout line PXO (e.g., a second readout line) connected to the dummy pixel 31d does not read the first voltage V1 of the dummy pixel 31d, wherein the second readout line is connected to the second capacitor $C_{Time}$ of the dummy pixel 31d, but is connected to or not connected to the first capacitor $C_{FD}$ of the dummy pixel 31d. When the second readout line is connected to the first capacitor $C_{FD}$ of the dummy pixel 31d, the first voltage V1 is not read according to the control signal generated by the timing controller 33. As mentioned above, in another aspect the first voltage V1 of the dummy pixel 31d is read but is not processed by the processor 39.

According to the arranged positions of the dummy pixel 31d and the normal pixel 31n, the first readout line and the second readout line are the same readout line or different readout lines as long as the processor 39 is able to respectively receive voltage values generated by the dummy pixel 31d and the normal pixel 31n for post-processing.

The first circuit C10 includes a photodiode PD, a transfer transistor T11, a reset transistor T12, a source follower transistor T13, a readout transistor T14 and a first capacitor $C_{FD}$. The photodiode PD is exposed within an exposure period (e.g., referring to FIGS. 6 and 7) to generate charges. The first capacitor $C_{FD}$ stores charges generated by the photodiode PD and passing the transfer transistor T11 to generate a first voltage V1 to be outputted via the readout line PXO. The reset transistor T12 is used to reset a potential of the first capacitor $C_{FD}$ to a reset voltage, which is close to $V_{DD}$. The readout transistor T14 is conducted by a readout signal RS_FD within a reading period to read a first voltage V1 of the first capacitor $C_{FD}$. The source follower transistor T13 is used to nondestructively buffer the voltage value of the first capacitor $C_{FD}$ to the readout circuit 35.

The second circuit C20 includes a control circuit C201 and a timing circuit C202. The control circuit C201 is connected to the first capacitor $C_{FD}$ of the first circuit C10, and used to generate a control signal Vy according to a voltage drop on the first capacitor $C_{FD}$ before the transfer transistor T11 of the first circuit C10 is conducted to transfer the charges generated by the photodiode PD to the first capacitor $C_{FD}$. FIG. 5 shows that the control signal Vy is generated from a voltage Vx passing an inverter INV. It is appreciated that the inverter INV is included in the control circuit C201 or in the timing circuit C202 without particular limitations.

The control circuit C201 includes transistors T21, T25 and T26 to form an auto-zero circuit. When the gate control signal AZ is at HIGH to conduct the transistor T21, the auto-zero mechanism thereof causes the current I1 to be equal to the current I2. After the gate control signal AZ is changed to LOW to close the transistor T21, a value of the current I1 changes with a variation of the voltage value $V_{FD}$ to accordingly change a voltage level of the voltage Vx, e.g., referring to FIG. 7.

The timing circuit C202 is connected to the control circuit C201, and used to determine a discharging time of the second capacitor $C_{Time}$ in the timing circuit C202 to generate a second voltage V2. The timing circuit C202 includes a constant current source $I_{CT}$ and a control transistor T27. The control transistor T27 is connected between the constant current source $I_{CT}$ and the second capacitor $C_{Time}$ to stop discharging the second capacitor $C_{Time}$ using the constant current source $I_{CT}$. The value of the second voltage V2 reflects a discharging time interval (i.e. Tof in FIG. 7) of the second capacitor $C_{Time}$ from the second capacitor $C_{Time}$ being reset in a reset phase.

The timing circuit C202 further includes a reset transistor T22, a readout transistor T24 and a source follower transistor T23. The reset transistor T22 is used to reset a potential of the second capacitor $C_{Time}$ to a reset voltage, which is close to $V_{DD}$. The readout transistor T24 is conducted by a readout signal RS_CT within a reading period to read the second voltage V2 of the second capacitor $C_{Time}$. The source follower transistor T23 is used to nondestructively buffer the voltage value of the second capacitor $C_{Time}$ to the readout circuit 35.

Figure 6:
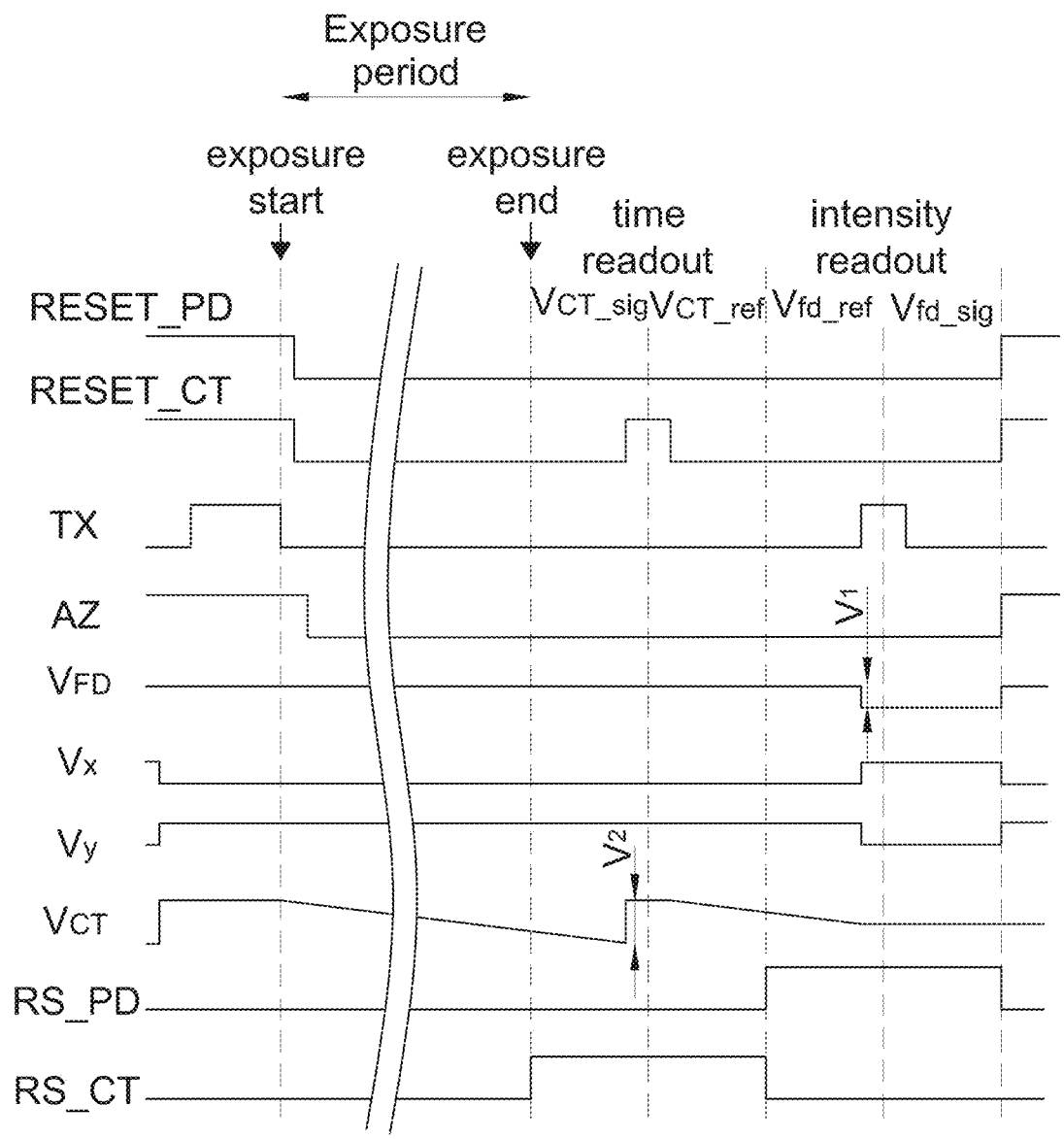
FIG. 6 is an operational timing diagram of the pixel circuit in FIG. 5 without overexposure.

Please referring to FIG. 6, it is an operational timing diagram of the pixel circuit 500 in FIG. 5 whose photodiode does not have an overflow within an exposure period. Before the exposure is started, the photodiode PD, the first capacitor $C_{FD}$ and the second capacitor $C_{Time}$ are reset. The resetting procedure is performed by setting a gate voltage RESET_FD of the reset transistor T12, a gate voltage RESET_CT of the reset transistor T22, a gate voltage TX of the transfer transistor T11, and a gate voltage AZ of the transistor T21 at high levels, wherein the gate control signals RESET_FD, RESET_CT, TX and AZ are generated by, for example, the timing controller 33, but not limited to. The first capacitor $C_{FD}$ and the second capacitor $C_{Time}$ are reset to a reset voltage close to $V_{DD}$, e.g., $V_{DD}$-0.6 volt, but not limited to. As mentioned above, in the reset interval (e.g., an interval during which RESET_FD and RESET_CT at high), the auto-zero operation of the control circuit C201 causes I1=I2.

FIG. 6 shows the operational timing diagram of the normal pixel 31n, and the operation of the dummy pixel 31d is similar to FIG. 6 but has a difference that voltages $V_{FD}$, Vx, and Vy are substantially maintained at identical values due to that the photodiode PD thereof does not receive incident light. Other operations of the dummy pixel 31d are identical to the normal pixel 31n in FIG. 6, and thus details thereof are not repeated herein. The second voltage V2 outputted by the dummy pixel 31d is used as a reference voltage Vref.

After the exposure period is started, the gate control signals RESET_FD, RESET_CT, TX and AZ are changed to low levels. If the photodiode PD does not causes an overflow, the voltage value $V_{FD}$ of the first capacitor $C_{FD}$ does not change within the exposure period and the level of the control signal Vy is maintained at HIGH to cause the constant current source $I_{CT}$ to continuously discharge the second capacitor $C_{Time}$ from the reset voltage to the end of the exposure period. For example, FIG. 6 shows that the voltage value $V_{CT}$ on the second capacitor $C_{Time}$ continuously decreases till the transistor T22 is conducted by RESET_CT in the reading period. It is appreciated that if the voltage value $V_{CT}$ on the second capacitor $C_{Time}$ is discharged to empty before being read, the voltage value $V_{CT}$ is read substantially equal to 0.

In the present disclosure, as the readout circuit 35 performs the correlation double sampling, the reset transistor T22 resets a potential of the second capacitor $C_{Time}$ within a time readout period by changing the gate control signal RESET_CT to HIGH so as to respectively read voltage values $V_{CT\_sig}$ and $V_{CT\_ref}$ before and after the resetting of the second capacitor $C_{Time}$ within the time readout period, wherein $V_{CT\_ref} > V_{CT\_sig}$. A readout signal RS_CT is used to conduct the readout transistor T24 to sequentially output the two voltage values $V_{CT\_sig}$ and $V_{CT\_ref}$ to the readout circuit 35 via the readout line PXO for the differential operation. The differential operation obtains the second voltage V2, i.e. $V2 = V_{CT\_ref} - V_{CT\_sig}$.

The transfer transistor T11 is used to transfer charges of the photodiode PD to the first capacitor $C_{FD}$ in an intensity readout period by changing the gate control signal TX to HIGH so as to respectively read voltage values $V_{fd\_ref}$ and $V_{fd\_sig}$ before and after the transferring charges to the first capacitor $C_{FD}$ within the intensity readout period, wherein $V_{fd\_ref} > V_{fd\_sig}$. A readout signal RS_FD is used to conduct the readout transistor T14 to sequentially output the two voltage values $V_{fd\_ref}$ and $V_{fd\_sig}$ to the readout circuit 35 via the readout line PXO for the differential operation. The differential operation obtains the first voltage V1, i.e. $V1 = V_{fd\_ref} - V_{fd\_sig}$.

In the present disclosure, the readout signals RS_CT and RS_FD are generated by, for example, the timing controller 33, but not limited to. The time readout period is prior to the intensity readout period.

Figure 7:
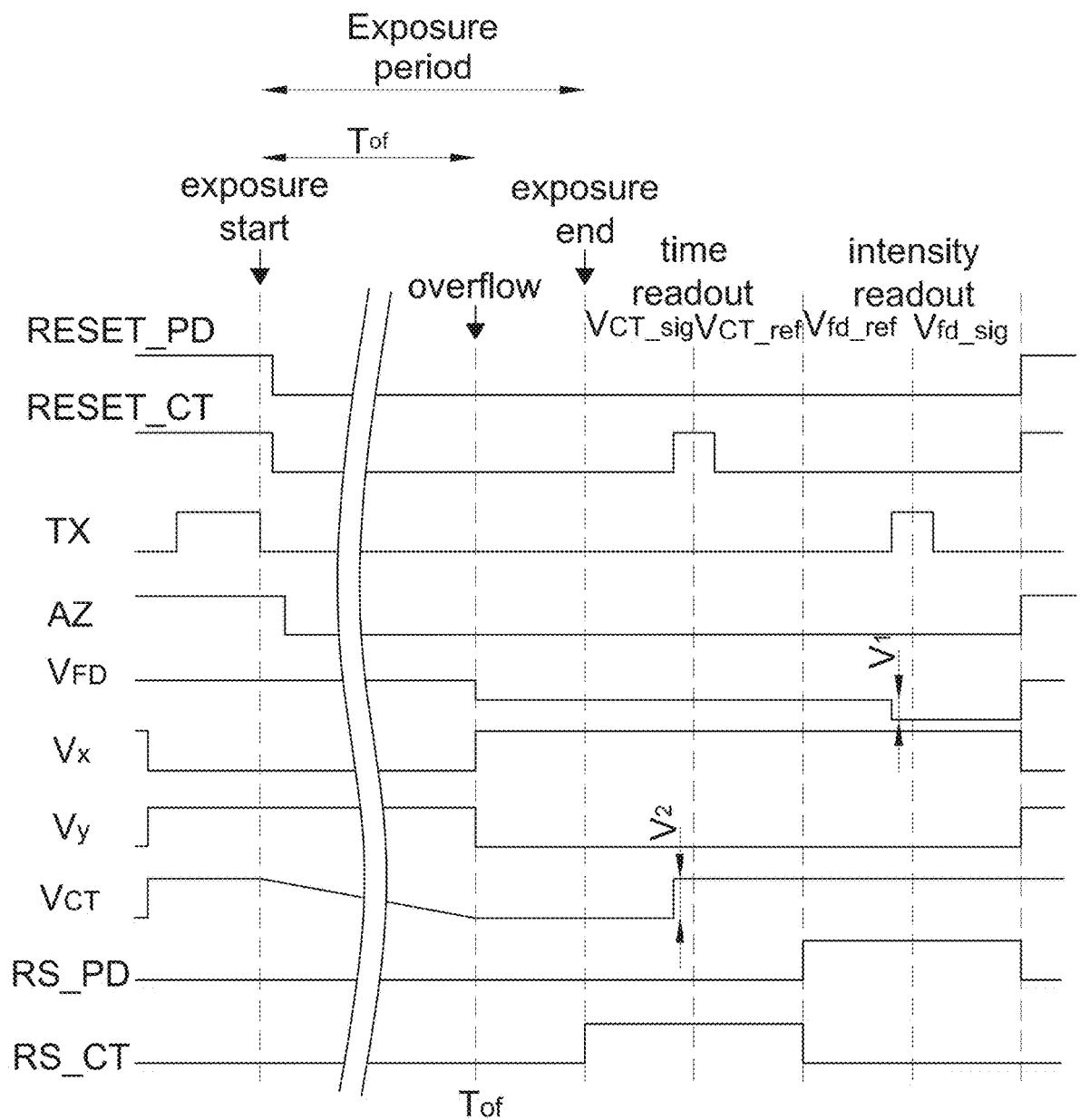
FIG. 7 is an operational timing diagram of the pixel circuit in FIG. 5 with overexposure.

Please referring FIG. 7, it is an operational timing diagram of the pixel circuit 500 in FIG. 5 whose photodiode has an overflow within an exposure period. The operation before the exposure period is started is identical to FIG. 6 and has been described above, and thus details thereof are not repeated herein. FIG. 7 shows that the photodiode PD causes an overflow at time Tof within the exposure period. As mentioned above, in the reset phase the current I1 of the control circuit C201 is substantially identical to the current I2 by conducting the transistor T21. When the photodiode PD has an overflow in the exposure period, some charges are generated to pass the transfer transistor T11 and leak to the first capacitor $C_{FD}$ to cause the voltage value $V_{FD}$ to drop at the time Tof. This voltage drop causes the current I1 to be larger than the current I2 to lift the voltage Vx at the time Tof. After passing the inverter INV, the control signal Vy has a voltage drop to close the control transistor T27. In this way, the control circuit C201 controls, using the control signal Vy, the control transistor T27 to stop discharging the second capacitor $C_{Time}$ using the constant current source $I_{CT}$ corresponding to the overflow (e.g., at time point Tof). Therefore, the discharged voltage of the second capacitor $C_{Time}$ is used to represent an overflow time in the present disclosure.

Next, in the time readout period, the readout circuit 35 sequentially reads two voltages $V_{CT\_sig}$ and $V_{CT\_ref}$ via the readout line POX for calculating the second voltage V2. In the intensity readout period, the readout circuit 35 sequentially reads two voltages $V_{fd\_ref}$ and $V_{fd\_sig}$ via the readout line POX for calculating the first voltage V1. The operations in the time readout period and the intensity readout period are similar to FIG. 6 as mentioned above, and thus details thereof are not repeated herein.

As the dummy pixel 31d does not have an overflow, the operation in FIG. 7 does not occur in the dummy pixel 31d.

After receiving the first voltage V1, the second voltage V2 and the reference voltage Vref, the processor 39 calculates V1×(Vref/V2) to obtain a real intensity value, wherein if there is no overflow, Vref is substantially identical to V2; whereas if an overflow occurs, Vref>V2 to amplify the first voltage V1. That is, the first voltage V1 represents If in FIG. 2, the second voltage represents Tof in FIG. 2, and the reference voltage represents Ep in FIG. 2.

Figure 8:
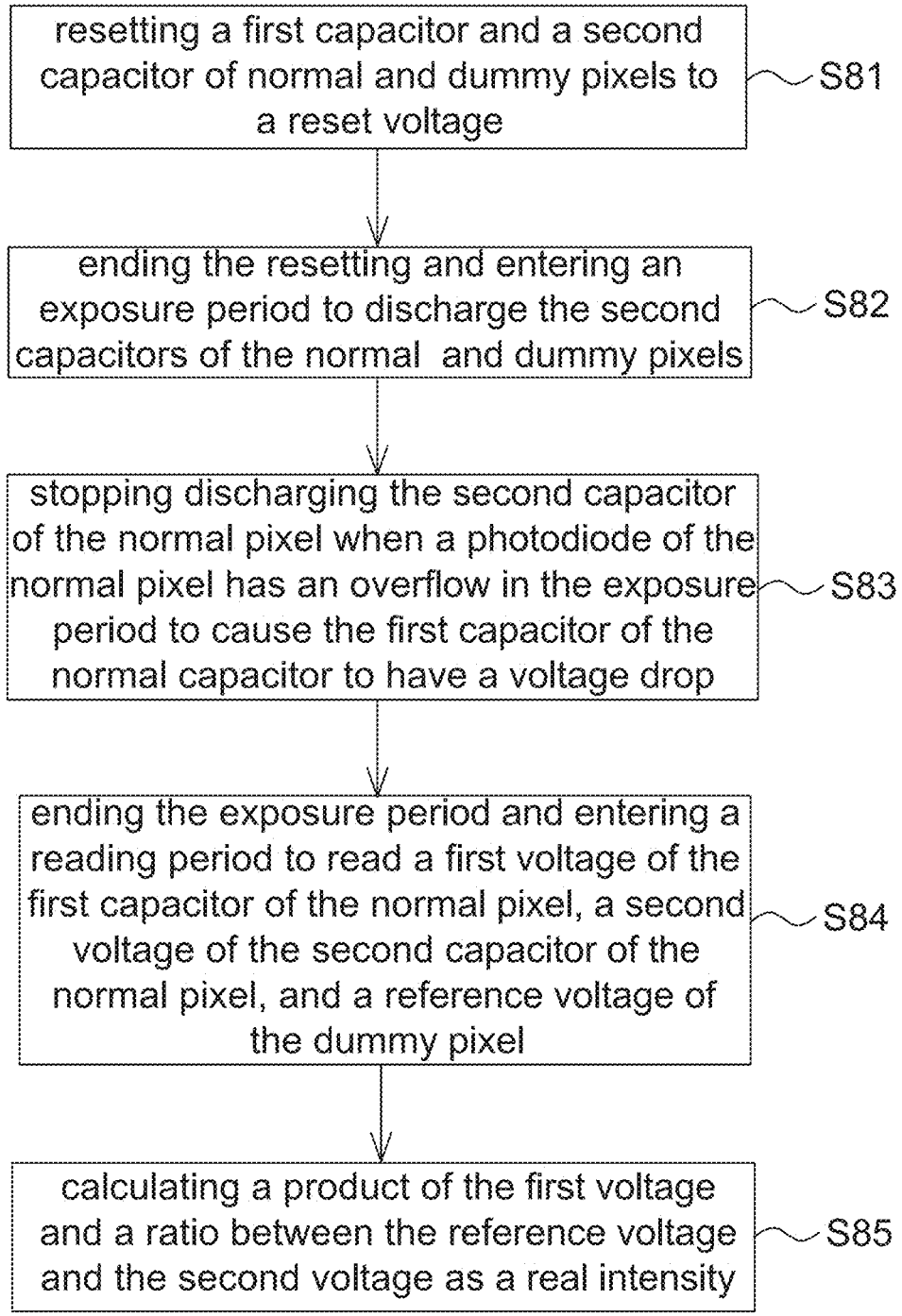
FIG. 8 is a flow chart of an operating method of a pixel circuit according to one embodiment of the present disclosure.

Referring to FIG. 8, it is a flow chart of an operating method of a pixel array according to one embodiment of the present disclosure. The operating method is adaptable to the optical sensor 300 in FIG. 3 and the pixel circuit 500 in FIG. 5. The operating method includes the steps of: resetting a first capacitor $C_{FD}$ and a second capacitor $C_{Time}$ of a normal pixel 31n and a dummy pixel 31d to a reset voltage (Step S81); ending the resetting and entering an exposure period to discharge the second capacitors $C_{Time}$ of the normal pixel 31n and the dummy pixel 31d (Step S82); stopping the discharging of the second capacitor $C_{Time}$ of the normal pixel 31n when a photodiode PD of the normal pixel 31n has an overflow within the exposure period to cause the first capacitor $C_{FD}$ of the normal pixel 31n to have a voltage drop (Step S83); ending the exposure period and entering a reading period to respectively read a first voltage V1 of the first capacitor $C_{FD}$ of the normal pixel 31n, a second voltage V2 of the second capacitor $C_{Time}$ of the normal pixel 31n and a reference voltage Vref of the second capacitor $C_{Time}$ of the dummy pixel 31d (Step S84); and calculating a product of the first voltage V1 and a ratio between the reference voltage Vref and the second voltage V2 as a real intensity (Step S85).

Details of this operating method have being described above, e.g., referring to FIG. 7, and thus are not repeated herein. Furthermore, FIG. 8 shows an aspect that an overflow occurs within the exposure period. If no overflow occurs in the exposure period, the operation is shown in FIG. 6.

As shown in FIG. 7, in each image frame acquired by the optical sensor 300, the operation of every pixel circuit includes three phases: a reset phase (i.e. before the exposure period in FIGS. 6-7), an exposing phase and a readout phase, wherein the readout phase including a time readout phase and an intensity readout phase to respectively read voltage values of the second capacitor $C_{Time}$ and the first capacitor $C_{FD}$.

In the time readout phase, the operating method of the present disclosure further includes: secondly resetting the second capacitor $C_{Time}$ of the normal pixel 31n; respectively reading a voltage value $V_{CT\_sig}$ and $V_{CT\_ref}$ of the second capacitor $C_{Time}$ before and after the secondly resetting the second capacitor $C_{Time}$; and calculating a difference $V_{CT\_ref} - V_{CT\_sig}$ between the voltage values read respectively before and after the secondly resetting as the second voltage V2. In one aspect, it is considered that the second voltage V2 outputted by the second circuit C20 includes voltage values $V_{CT\_sig}$ and $V_{CT\_ref}$ for the processor 39 to calculate a difference therebetween. According to different arrangement, the processor 39 calculates $V_{CT\_sig} - V_{CT\_ref}$.

In the intensity readout phase, the operating method of the present disclosure further includes: transferring charges of the photodiode PD to the first capacitor $C_{FD}$ of the normal pixel 31n; respectively reading a voltage value $V_{fd\_ref}$ and $V_{fd\_sig}$ of the first capacitor $C_{FD}$ before and after the transferring charges; and calculating a difference $V_{fd\_ref} - V_{fd\_sig}$ between the voltage values read respectively before and after the transferring charges as the first voltage V1. In one aspect, it is considered that the first voltage V1 outputted by the first circuit C10 includes voltage values $V_{fd\_ref}$ and $V_{fd\_sig}$ for the processor 39 to calculate a difference therebetween. According to different arrangement, the processor 39 calculates $V_{fd\_sig}$-$V_{fd\_ref}$.

In the operation of the dummy pixel 31d, the time readout phase is performed but the intensity readout phase is not performed (i.e. not reading the voltage value of the first capacitor $C_{FD}$ of the dummy pixel 31d) because the voltage on the first capacitor $C_{FD}$ of the dummy pixel 31d does not change and does not contain required information. Therefore, even though the intensity readout phase is performed, 0 is obtained after the differential operation. The time readout phase of the dummy pixel 31d also includes: secondly resetting the second capacitor $C_{Time}$ of the dummy pixel 31d; respectively reading a voltage value $V_{CT\_sig}$ and $V_{CT\_ref}$ of the second capacitor $C_{Time}$ before and after the secondly resetting the second capacitor $C_{Time}$; and calculating a difference $V_{CT\_ref}$-$V_{CT\_sig}$ between the voltage values read respectively before and after the secondly resetting as the reference voltage Vref.

Referring to FIG. 2 and FIGS. 5-7, the present disclosure provides a method of calculating a real intensity of a pixel circuit. As shown in FIG. 5, the pixel circuit includes a first capacitor $C_{FD}$ and a second capacitor $C_{Time}$. The method including the steps of: resetting a pixel circuit 500; exposing the pixel circuit 500 within an exposure period Ep; reading a time point Tof at which the first capacitor $C_{FD}$ of the pixel circuit 500 has a voltage drop before an end of the exposure period Ep as well as reading a first voltage V1 of the first capacitor $C_{FD}$ after the voltage drop; and calculating a real intensity based on a ratio between the exposure period Ep and a time interval between a start of the exposing and the time point Tof, e.g., calculating a product of the first voltage V1 and the ratio between the exposure period Ep and the time interval.

As mentioned above, the first voltage V1 is, for example, a full well capacity (FWC) of the pixel circuit 500 or a fraction of the FWC. The time point Tof is determined, for example, according a voltage read from the second capacitor $C_{Time}$, i.e. V2. The exposure period Ep is determined, for example, according to a capacitor voltage (i.e. the second capacitor thereof) read from a dummy pixel.

One benefit of using the pixel array of the present disclosure is that because the processor 39 calculates and obtains the real exposure information, the auto exposure of the optical sensor 300 is accomplished using one image frame which is much faster than the conventional auto exposure procedure requiring multiple image frames.

As mentioned above, the conventional optical sensor can only output full-scale digital values when the over exposure occurs such that the actual ambient light brightness cannot be reflected. Therefore, the present disclosure further provides a pixel circuit (FIG. 5), and a pixel array including the same and an operation of the pixel array (FIG. 8) that stores the voltage value associated with the overflow time such that even the ADC outputs full-scale digital values, the actual ambient light intensity is still obtainable using the digital operation.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:
1. A pixel circuit, comprising:
a first circuit, comprising:
a photodiode configured to be exposed in an exposure period;
a transfer transistor; and
a first capacitor configured to store charges generated by the photodiode via the transfer transistor to generate a first voltage; and
a second circuit, comprising:
a control circuit, connected to the first capacitor, and configured to generate a control signal according to a voltage drop on the first capacitor before the transfer transistor is conducted to transfer the charges generated by the photodiode to the first capacitor; and
a timing circuit, connected to the control circuit, and configured to determine a discharging time of a second capacitor in the timing circuit according to the control signal to generate a second voltage,
wherein the first voltage is associated with light intensity, and the second voltage is associated with an overflow time.

2. The pixel circuit as claimed in claim 1, wherein the timing circuit comprises:
the second capacitor;
a constant current source; and
a control transistor, connected between the constant current source and the second capacitor, and configured to stop discharging the second capacitor by the constant current source according to the control signal.

3. The pixel circuit as claimed in claim 2, wherein
when the photodiode has an overflow within the exposure period, the control circuit controls the control transistor to stop, corresponding to the overflow, discharging the second capacitor by the constant current source according to the control signal, and
when the photodiode does not have the overflow within the exposure period, the constant current source discharges the second capacitor to an end of the exposure period.

4. The pixel circuit as claimed in claim 2, wherein the timing circuit further comprises:
a reset transistor configured to reset a potential of the second capacitor within a reading period; and
a readout transistor configured to read the second voltage of the second capacitor within the reading period,
wherein the reset transistor is configured to reset the potential of the second capacitor within the reading period to respectively read a voltage value before and after the resetting of the second capacitor within the reading period to perform correlation double sampling on the second capacitor.

5. The pixel circuit as claimed in claim 1, wherein the first circuit further comprises:
a reset transistor configured to reset a potential of the first capacitor within a reset interval; and
a readout transistor configured to read the first voltage of the first capacitor within a reading period,
wherein the transfer transistor is configured to transfer the charges generated by the photodiode to the first capacitor within the reading period to respectively read a voltage value before and after the transferring of the charges generated by the photodiode to the first capacitor to perform correlation double sampling on the first capacitor.

6. The pixel circuit as claimed in claim 1, wherein the first capacitor and the second capacitor are coupled to a same readout line which sequentially reads the second voltage and the first voltage.

7. A pixel array, comprising:
multiple normal pixels and at least one dummy pixel, wherein
each of the multiple normal pixels comprises:
  a first circuit, comprising:
    a photodiode configured to be exposed in an exposure period;
    a transfer transistor; and
    a first capacitor configured to store charges generated by the photodiode via the transfer transistor to generate a first voltage; and
  a second circuit, comprising:
    a control circuit, connected to the first capacitor, and configured to generate a control signal according to a voltage drop on the first capacitor before the transfer transistor is conducted to transfer the charges generated by the photodiode to the first capacitor; and
    a timing circuit, connected to the control circuit, and configured to determine a discharging time of a second capacitor in the timing circuit according to the control signal to generate a second voltage; and
the at least one dummy pixel has a same pixel structure with the normal pixel, and a second capacitor of the at least one dummy pixel is configured to generate a reference voltage;
wherein a product of the first voltage and a ratio between the reference voltage and the second voltage is configured as a real intensity.

8. The pixel array as claimed in claim 7, wherein the at least one dummy pixel is covered by an opaque layer to cause a photodiode of the at least one dummy pixel unable to be exposed within the exposure period.

9. The pixel array as claimed in claim 7, further comprising a first readout line and a second readout line, wherein
the first readout line is connected to the first capacitor and the second capacitor of one normal pixel, and
the second readout line is connected to a second capacitor of one dummy pixel but is not connected to a first capacitor of the one dummy pixel.

10. The pixel array as claimed in claim 7, further comprising a first readout line and a second readout line, wherein
the first readout line is connected to the first capacitor and the second capacitor of one normal pixel, and
the second readout line is connected to a first capacitor and a second capacitor of one dummy pixel but is not configured to read a voltage value of the first capacitor of the one dummy pixel.

11. The pixel array as claimed in claim 7, wherein the pixel array comprises one dummy pixel, and the reference voltage generated by the one dummy pixel is used to calculate the real intensity of all normal pixels.

12. The pixel array as claimed in claim 7, wherein the pixel array comprises a row of dummy pixels, and each dummy pixel among the row of dummy pixels corresponds to one column of normal pixels for calculating the real intensity of the one column of normal pixels.

13. The pixel array as claimed in claim 7, wherein the timing circuit comprises:
the second capacitor;
a constant current source; and
a control transistor, connected between the constant current source and the second capacitor, and configured to stop discharging the second capacitor by the constant current source according to the control signal.

14. The pixel array as claimed in claim 13, wherein the timing circuit further comprises:
a reset transistor configured to reset a potential of the second capacitor within a reading period; and
a readout transistor configured to read the second voltage of the second capacitor within the reading period,
wherein the reset transistor is configured to reset the potential of the second capacitor within the reading period to respectively read a voltage value before and after the resetting of the second capacitor within the reading period to perform correlation double sampling on the second capacitor.

15. The pixel array as claimed in claim 7, wherein the first circuit further comprises:
a reset transistor configured to reset a potential of the first capacitor within a reset interval; and
a readout transistor configured to read the first voltage of the first capacitor within a reading period,
wherein the transfer transistor is configured to transfer the charges generated by the photodiode to the first capacitor within the reading period to respectively read a voltage value before and after the transferring of the charges generated by the photodiode to the first capacitor to perform correlation double sampling on the first capacitor.

16. A method of calculating a real intensity of a pixel circuit, the method comprising:
resetting the pixel circuit;
exposing the pixel circuit within an exposure period;
reading a time point at which a first capacitor of the pixel circuit has a voltage drop before an end of the exposure period as well as a first voltage of the first capacitor after the voltage drop; and
calculating the real intensity based on a ratio between the exposure period and a time interval between a start of the exposing and the time point.

17. The method as claimed in claim 16, wherein the first voltage is a full well capacity of the pixel circuit or a fraction of the full well capacity.

18. The method as claimed in claim 16, wherein the pixel circuit further comprises a second capacitor, and the time point is determined according a voltage of the second capacitor.

19. The method as claimed in claim 16, wherein the real intensity is calculated as a product of the first voltage and the ratio between the exposure period and the time interval.

20. The method as claimed in claim 16, wherein the exposure period is determined according to a capacitor voltage read from a dummy pixel.

* * * * *